(12) United States Patent
Sugahara

(10) Patent No.: US 7,781,324 B2
(45) Date of Patent: Aug. 24, 2010

(54) METHOD OF PRODUCING WIRE-CONNECTION STRUCTURE, AND WIRE-CONNECTION STRUCTURE

(75) Inventor: Hiroto Sugahara, Aichi-ken (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 403 days.

(21) Appl. No.: 11/475,876

(22) Filed: Jun. 28, 2006

(65) Prior Publication Data

US 2007/0000970 A1 Jan. 4, 2007

(30) Foreign Application Priority Data

Jun. 30, 2005 (JP) ............... 2005-190947

(51) Int. Cl.
*H01L 21/44* (2006.01)
(52) U.S. Cl. ............... 438/612; 257/E21.517
(58) Field of Classification Search ........... 438/612
See application file for complete search history.

(56) References Cited

U.S. PATENT DOCUMENTS

| | | | |
|---|---|---|---|
| 4,412,642 A | 11/1983 | Fisher, Jr. | |
| 4,830,264 A | 5/1989 | Bitaillou et al. | |
| 5,435,480 A | 7/1995 | Hart et al. | |
| 6,501,663 B1 * | 12/2002 | Pan | 361/779 |
| 2003/0098342 A1 * | 5/2003 | Ohashi et al. | 228/256 |
| 2004/0111070 A1 * | 6/2004 | Hanley | 604/295 |
| 2004/0113246 A1 * | 6/2004 | Boon | 257/678 |
| 2005/0056681 A1 | 3/2005 | Cobbley et al. | |

FOREIGN PATENT DOCUMENTS

| | | |
|---|---|---|
| EP | 0 263 222 A1 | 4/1988 |
| JP | 2001 250842 | 9/2001 |
| JP | 2003 318542 | 11/2003 |
| WO | 83/03216 A1 | 9/1983 |

OTHER PUBLICATIONS

European Patent Office, European Search Report for EP Appl'n No. 06013513.4-1231 (counterpart to the above-captioned U.S. patent application) dated Mar. 19, 2008.

* cited by examiner

*Primary Examiner*—Thao X Le
*Assistant Examiner*—Elias Ullah
(74) *Attorney, Agent, or Firm*—Baker Botts, LLP.

(57) ABSTRACT

For electrically connecting a wiring formed on one surface of an insulating substrate such as an FPC to an individual electrode arranged facing the other surface of the substrate, firstly, a through hole and a notch are formed by irradiating a laser beam from above onto the FPC. Next, the FPC is arranged to be positioned such that the individual electrode, the through hole and the notch are overlapped in a plan view. Next, an electroconductive liquid droplet having a diameter greater than a width of the notch is jetted, toward an area formed with the notch, from the one surface side of the FPC. The landed electroconductive liquid droplet flows along the notch in a thickness direction of the substrate due to an action of a capillary force and reaches assuredly to the individual electrode, thereby electrically connecting the wiring and electrode arranged sandwiching the insulating substrate assuredly.

12 Claims, 13 Drawing Sheets

→ SCANNING DIRECTION

↙ PAPER FEEDING DIRECTION

SCANNING DIRECTION

PAPER FEEDING DIRECTION

METHOD OF PRODUCING WIRE-CONNECTION STRUCTURE, AND WIRE-CONNECTION STRUCTURE

CROSS REFERENCE TO RELATED APPLICATION

The present application claims priority from Japanese Patent Application No. 2005-190947, filed on Jun. 30, 2005, the disclosure of which is incorporated herein by reference in its entirety.

BACKGROUND OF THE INVENTION

1. Field of the Invention

The present invention relates to a method of producing a wire-connection structure for performing electrical connections, and the wire-connection structure.

2. Description of the Related Art

A wire-connection structure, in which contact points arranged with an insulating substrate sandwiched therebetween are electrically connected via an electroconductive material filled in through holes formed in the substrate, is available. As a method of producing such a wire-connection structure, for example, in a semiconductor apparatus described in Japanese Patent Application Laid-open No. 2001-250842 (FIG. 4), wirings formed on one surface of an insulating substrate and electrodes of a semiconductor chip arranged on an opposite side with respect to the wiring, sandwiching the substrate therebetween, are electrically connected by filling an electroconductive material in a form of a paste, a liquid, or a gel in through holes formed in the insulating substrate (substrate).

However, when the electroconductive material is filled to block the through holes entirely as in the semiconductor apparatus described in Japanese Patent Application Laid-open No. 2001-250842, air is remained in the through hole between the electrode of a semiconductor chip and the electroconductive material, and there is a fear that a poor (unsatisfactory) connection occurs. Further, when the electroconductive material is filled in the through holes, depending on a condition of a surface defining (forming) the through holes of the substrate, there is also a fear that the electroconductive material is not reached up to the opposite side of the substrate along the surface defining the through holes, thereby causing a poor connection. Other than filling the electroconductive material in the through holes in such a manner, it is also conceivable to electrically connect contact points, arranged to sandwich the substrate therebetween, by making the electroconductive material to flow, at a side wall of the substrate, from one surface of the substrate toward the other surface of the substrate. In this case also, however, depending on the condition of the side wall, there is a fear that the electroconductive material does not reach up to the other surface of the substrate along the side wall in some cases, thereby causing a poor connection.

SUMMARY OF THE INVENTION

An object of the present invention is to provide a method of producing a wire-connection structure which is capable of electrically connecting contact points arranged to sandwich an insulating substrate therebetween assuredly, and to provide a wire-connection structure in which the contact points arranged to sandwich the insulating substrate therebetween are electrically connected assuredly.

According to a first aspect of the present invention, there is provided a method of producing a wire-connection structure including:

an insulating substrate providing step of providing an insulating substrate which has a first surface and a second surface facing mutually, and in which a first space is formed to communicate the first surface with the second surface and a second space is formed to communicate with the first space;

a connection-objective member providing step of providing a connection-objective member having a contact point to be electrically connected to the insulating substrate;

an arranging step of arranging the insulating substrate and the connection-objective member such that an area, of the insulating substrate, in which the first space is formed faces the contact point of the connection-objective member; and a landing step of landing an electroconductive liquid droplet having a diameter greater than a width of the first space on the area of the insulating substrate in which the first space is formed.

According to the first aspect of the present invention, by landing the electroconductive liquid droplet having a diameter greater than the width of the first space on the area of the insulating substrate in which the first space is formed, for example, when the width of the first space is sufficiently small to generate an effective capillary force, the electroconductive liquid droplet, which has been landed on the area, infiltrates into the first space, and reaches up to the contact point of the connection-objective member. Further, at this time, there is no fear that air remains between the electroconductive liquid droplet and the contact point of the connection-objective member because the air in the first space can escape through the second space.

In the method of producing the wire-connection structure of the present invention, the second space may be a through hole which is formed in the insulating substrate and is formed to communicate the first surface with the second surface; the first space may be defined by a notch which is formed in an inner surface of the insulating substrate in which the through hole is defined; and the electroconductive liquid droplet may be landed, in the landing step, on an area including an area of the insulating substrate in which the notch has been formed and excluding a part of an area of the insulating substrate in which the through hole has been formed.

Accordingly, when the electroconductive liquid droplet is jetted from a side of the first surface of the insulating substrate such that the electroconductive liquid droplet lands into an area in which an opening of the notch is formed, the electroconductive liquid droplet flows along the notch and up to the second surface assuredly, due to the capillary force. Therefore, by a simple method of jetting the electroconductive liquid droplet such that the electroconductive liquid droplet lands into the opening of the notch, it is possible to extend the electroconductive material (in which the electroconductive liquid droplets are solidified) electrically connected to the contact point of the connection-objective member, up to the first surface via the notch and the through hole formed (defined) in the insulating substrate. Accordingly, on the first surface, an electric connection with the contact point of the connection-objective member via the electroconductive member can be made. Further, even when the notch is not formed, since a joining (connecting) area in which the electroconductive liquid droplet and the contact point of the connection-objective member are joined (connected) is increased by an area of a space occupied by the opening of the notch, a joining (connecting) strength is increased. Furthermore, by jetting the electroconductive liquid droplets such that the electroconductive liquid droplet is not landed on the entire area inside the opening of the through hole, no air is remained in the through hole between the electroconductive member and the connection-objective member. Accordingly, it is possible to prevent the occurrence of poor connection.

Further, in the method of producing the wire-connection structure, the notch may be formed as one single notch corresponding to the through hole. Accordingly, since the electroconductive liquid droplet is to be jetted only on one single notch, the contact point of connection-objective member and the electroconductive member can be easily conducted.

Further, in the method of producing the wire-connection structure of the present invention, the notch may be formed as a plurality of individual notches which are mutually separated and which correspond to the through hole; and the electroconductive liquid droplet may be landed separately for each of the individual notches in the landing step. Accordingly, in each of the individual notches, the electroconductive liquid droplet hardly flows in a direction other than a direction from the first surface to the second surface of the insulating substrate. Accordingly, when the electroconductive liquid droplet is jetted separately onto each of the individual notches, the electroconductive liquid droplet jetted on a certain individual notch is prevented from making a contact, inside the through hole, with the electroconductive liquid droplet jetted onto another individual notch adjacent to the certain individual notch. Therefore, in one through hole, the contact point of the connection-objective member and the electroconductive member can be brought in to contact assuredly, at a plurality of independent points.

Further, in the method of producing the wire-connection structure of the present invention, an inner surface, of the insulating substrate, defining the notch may be communicated with (continued up to) the first surface and formed as a tapered surface which is tapered toward the second surface; and the electroconductive liquid droplet may be landed on the tapered surface in the landing step. Accordingly, by jetting the electroconductive liquid droplet so as to land on the inclined surface, the electroconductive liquid droplet can be allowed to flow assuredly along the notch.

In the method of producing the wire-connection structure of the present invention, the tapered surface may be communicated with the first surface and the second surface. Accordingly, the electroconductive liquid droplet can be made to flow assuredly up to the second surface, along the tapered surface.

In the method of producing the wire-connection structure of the present invention, the second space may be defined by a side-wall surface, of the insulating substrate, which is formed to communicate the first surface with the second surface, and the first space may be defined by a notch which is formed in the side-wall surface and which has an opening in the first surface and an opening in the second surface of the insulating substrate; the opening of the notch formed in the second surface may be arranged to face the contact point of the connection-objective member in the substrate arranging step; and the electroconductive liquid droplet having the diameter greater than the width of the notch may be landed, in the landing step, on an area including the opening of the notch formed in the first surface of the insulating substrate.

Accordingly, when the electroconductive liquid droplet is jetted so as to land into the opening of the notch from the first surface, the electroconductive liquid droplet flows assuredly along the notch up to the second surface, due to the capillary force. Consequently, by a simple method of jetting the electroconductive liquid droplet to land into the opening of the notch, the electroconductive member electrically connected to the contact point of the connection-objective member can be extended up to the first surface via the notch formed in the insulating substrate. Accordingly, on the first surface, it is possible to perform electrical connection with the connection-objective member via the electroconductive member. Further, as compared to a case in which the notch is not provided, since the joining (connecting) area is increased by the area of the space occupied by the opening of the notch, the joining strength is increased.

Further, in the method of producing the wire-connection structure, the notch may be formed as a plurality of individual notches which are mutually separated and arranged along the side-wall surface; and the electroconductive liquid droplet may be landed separately for each of the individual notches in the landing step. Accordingly, in each of the individual notches, the electroconductive liquid droplet hardly flows in a direction other than the direction from the first surface to the second surface. Accordingly, when the electroconductive liquid droplet is jetted separately onto each of the individual notches, the electroconductive liquid droplet jetted on a certain individual notch is prevented from making a contact, on the side wall of the insulating member, with the electroconductive liquid droplet jetted onto another individual notch adjacent to the certain individual notch. Consequently, the contact point of the connection-objective member and the electroconductive member can be conducted assuredly, at a plurality of independent points, on the side wall of the insulating substrate.

Further, in the method of producing the wire-connection structure of the present invention, an inner surface of the insulating substrate defining the notch may be communicated with the first surface, and may be formed as a tapered surface which is tapered toward the second surface; and the electroconductive liquid droplet may be landed on the tapered surface in the landing step. Accordingly, by jetting the electroconductive liquid droplet to land on the inclined surface, the electroconductive liquid droplet can be made to flow assuredly along the notch.

In the method of producing the wire-connection structure, the tapered surface may be communicated with the first surface and the second surface. Accordingly, the electroconductive liquid droplet can be made to flow assuredly up to the second surface via the inclined surface.

Further, in the method of producing the wire-connection structure of the present invention, the electroconductive liquid droplet may be landed in the landing step such that the electroconductive liquid droplet is arisen above the first surface. Accordingly, a bump to be required while connecting a driver IC or the like to the first surface can be formed simultaneously in an electroconductive liquid droplet jetting step, and the producing process can be simplified.

In the method of producing the wire-connection structure of the present invention, dimensions of the first space may be dimensions which allow the electroconductive liquid droplet to flow toward the second surface by an action of the capillary force acting on the electroconductive liquid droplet. Thus, when the capillary force acting on the electroconductive liquid droplet is sufficiently substantial, when the electroconductive liquid droplet which is landed flows, the electroconductive liquid droplet can reach assuredly up to the contact point of the connection-objective member without being effected by an external force such as gravity.

In the method of producing the wire-connection structure of the present invention, a width of the first space may be smaller than a width of the second space. In this case, since the width of the first space is narrower than the width of the second space, by jetting the electroconductive liquid droplet toward the first space, it is possible to obtain the capillary force greater than the capillary force when the electroconductive liquid droplet is jetted toward the second space.

In the method of producing the wire-connection structure of the present invention, a width of a communicating portion which is a boundary between the first space and the second space may be smaller than the width of the first space. Accordingly, as the width of the communicating portion compared to the width of the first space is narrower, a contact area of the electroconductive liquid droplet and the surface defining the first space becomes greater, and therefore, the capillary force greater by dimensions of the increased contact space can be achieved.

According to a second aspect of the present invention, there is provided a wire-connection structure including:

an insulating substrate which has a first surface and a second surface facing mutually, and in which a first space which is formed to communicate the first surface with the second surface and a second space is formed to communicate with the first space;

a connection-objective member which has a contact point and which is arranged to face the second surface of the insulating substrate; and an electroconductive member which is arranged in the first space and the second space, which is electrically connected to the contact point of the connection-objective member, and which is formed to rise above the first surface of the insulating substrate.

According to the second aspect of the present invention, since the electroconductive member is arisen above the first surface of the insulating substrate, the electroconductive member can be used as a bump.

In the wire-connection structure of the present invention, the second space may be a through hole which is formed in the insulating substrate and which is formed to communicate the first surface with the second surface, and the first space may be defined by a notch which is formed in an inner surface of the insulating substrate in which the through hole is defined; and an opening of the notch and an opening of the through hole may be arranged to face the contact point of the connection-objective member. Alternatively, the second space may be defined by a side-wall surface, of the insulating substrate, which is formed to communicate the first surface with the second surface; and the first space may be defined by a notch which is formed in the side-wall surface of the insulating substrate and which has openings in the first surface and the second surface respectively. In any of the cases, since there is no fear that air is remained between the electroconductive member and the contact point of the connection-objective member, the reliability of electrical connection is very high.

DETAILED DESCRIPTION OF THE PREFERRED EMBODIMENTS

First Embodiment

A first embodiment according to the present invention will be described below with reference to the diagrams. The first embodiment is an example in which the present invention is applied to electrical connections in an ink-jet printer which performs recording on a recording paper by discharging ink from a nozzle.

Figure 1:
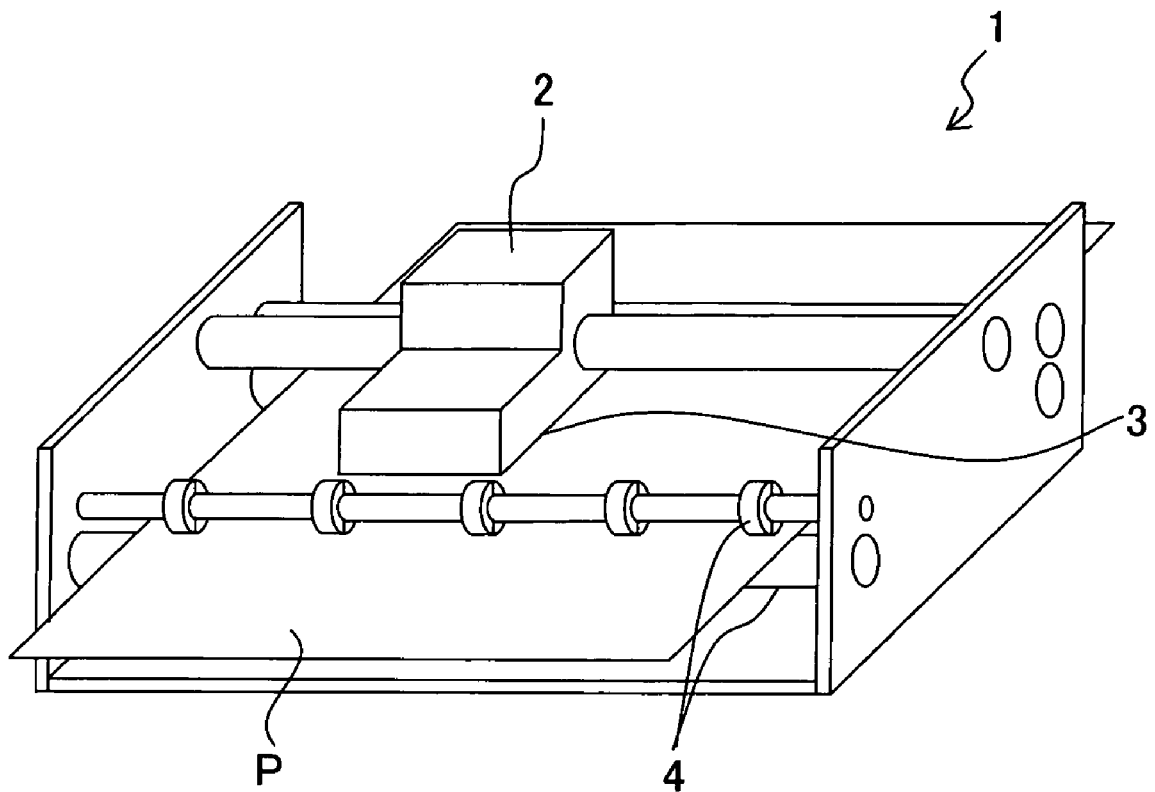
FIG. 1 is a schematic perspective view of an ink-jet printer according to a first embodiment of the present invention.

FIG. 1 is a schematic perspective view of an ink-jet printer 1 according to the first embodiment. As shown in FIG. 1, the ink-jet printer 1 includes a carriage 2 which is movable in a scanning direction (left and right direction in FIG. 1), an ink-jet head 3 of serial type which is provided on the carriage 2 and discharges ink onto a recording paper P, and transporting rollers 4 which transport or feed the recording paper P in a paper feeding direction (forward direction in FIG. 1). Further, the ink-jet head 3 moves integrally with the carriage 2 in the scanning direction, and records an image and/or a character (letter) on a recording paper P by discharging ink from nozzles 16 (see FIG. 2) onto a recording paper P. Further, the recording paper P with an image recorded thereon by the ink-jet head 3 is discharged in the paper feeding direction by the transporting rollers 4.

Figure 2:
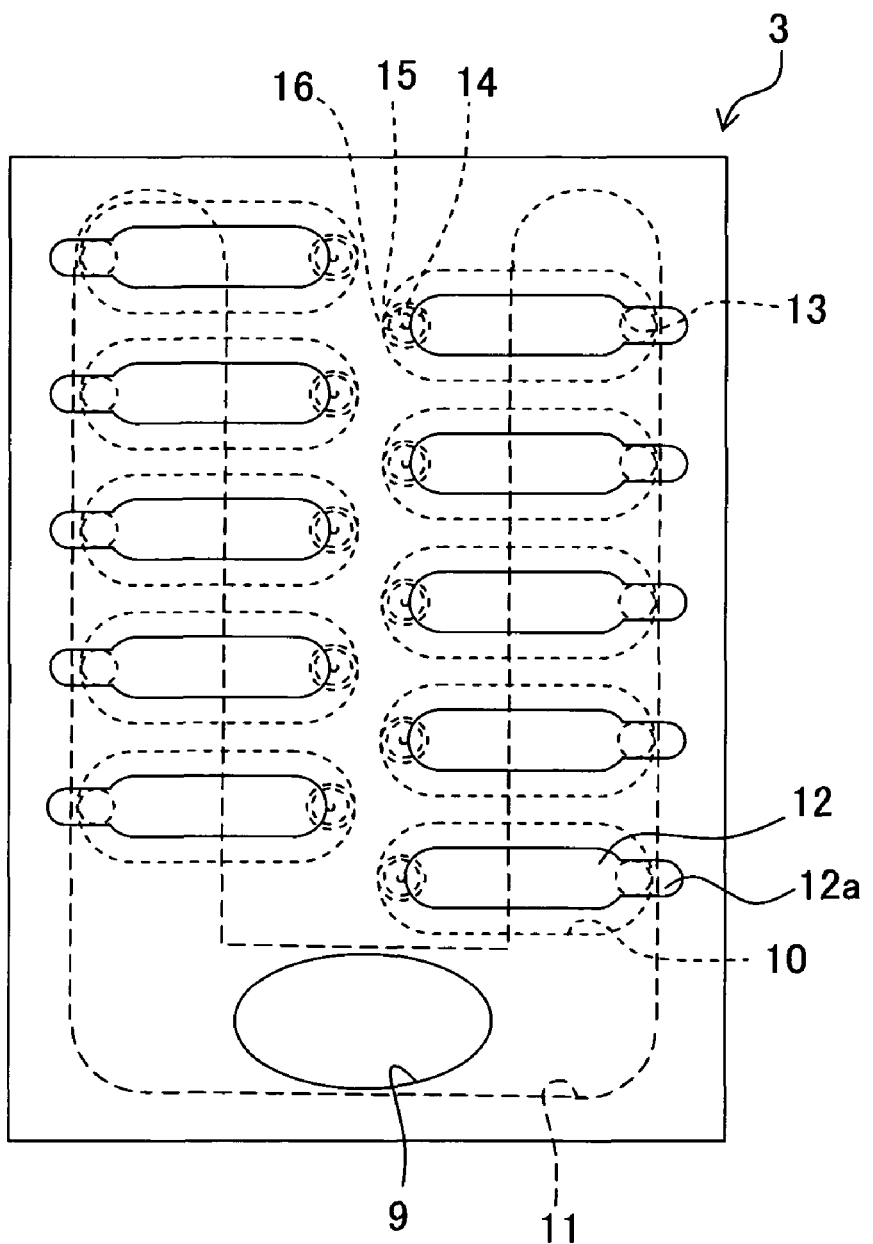
FIG. 2 is a plan view of an ink-jet head in FIG. 1.
Figure 3:
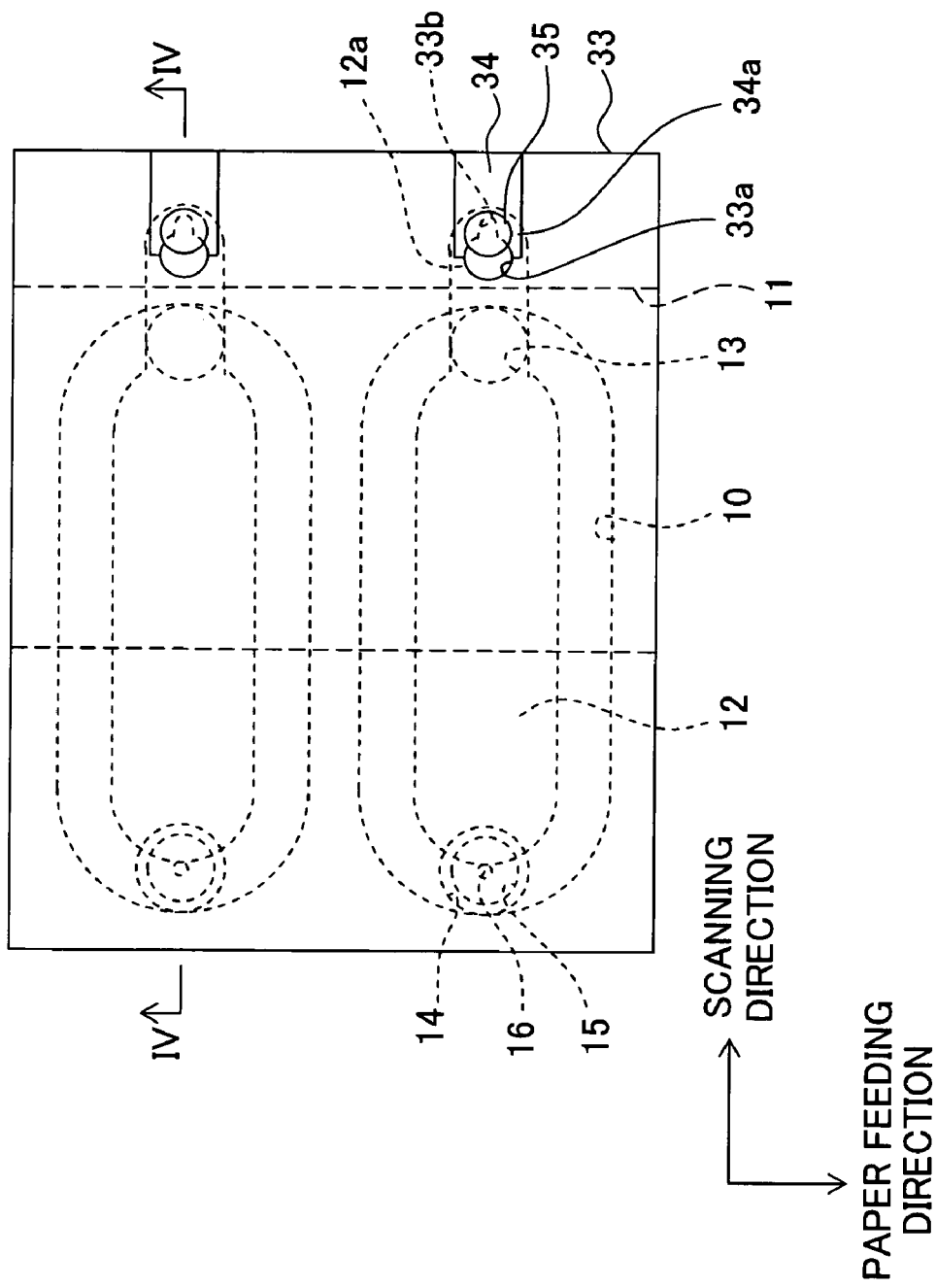
FIG. 3 is a partially enlarged view of FIG. 2.
Figure 4:
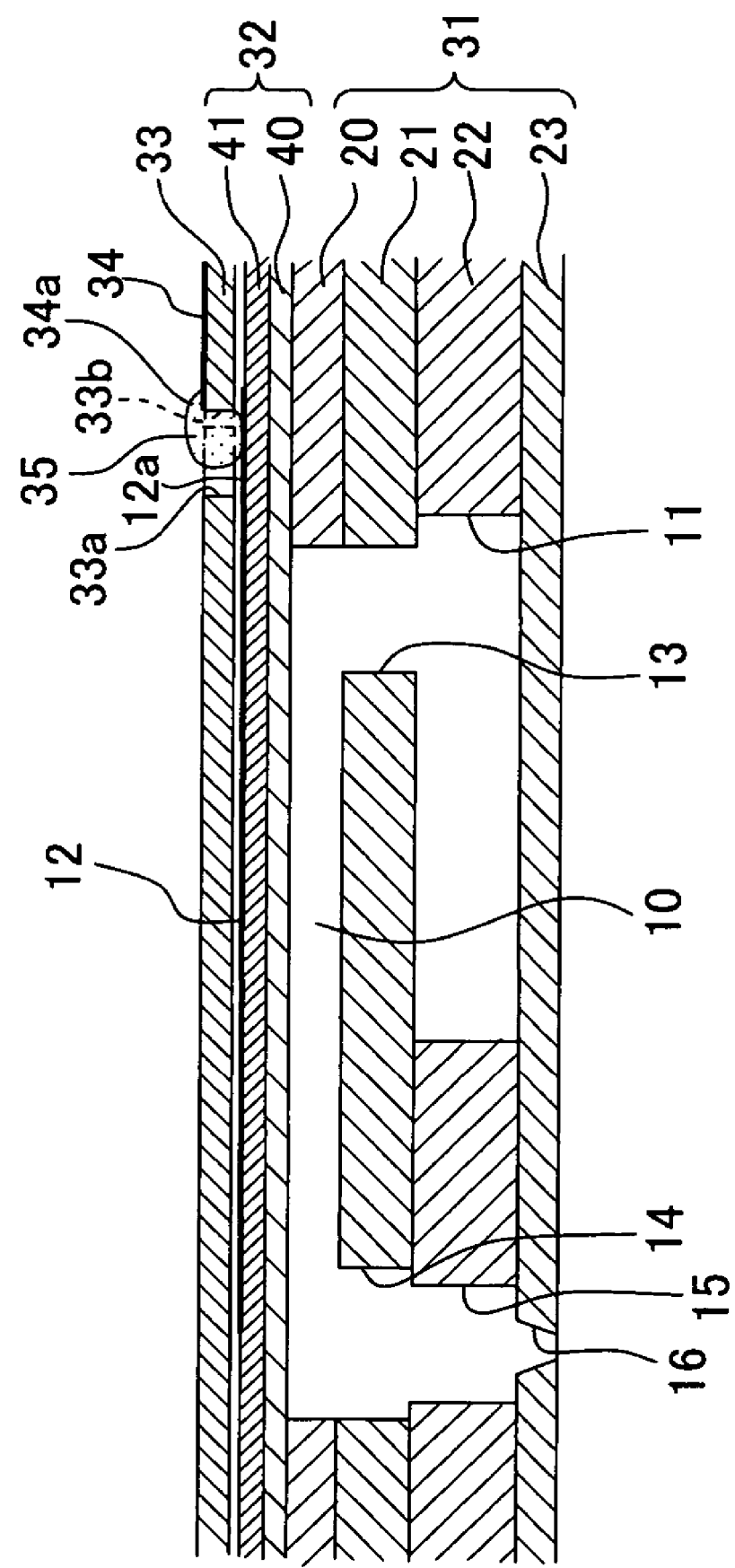
FIG. 4 is a cross-sectional view taken along a line IV-IV shown in FIG. 3.
Figure 5:
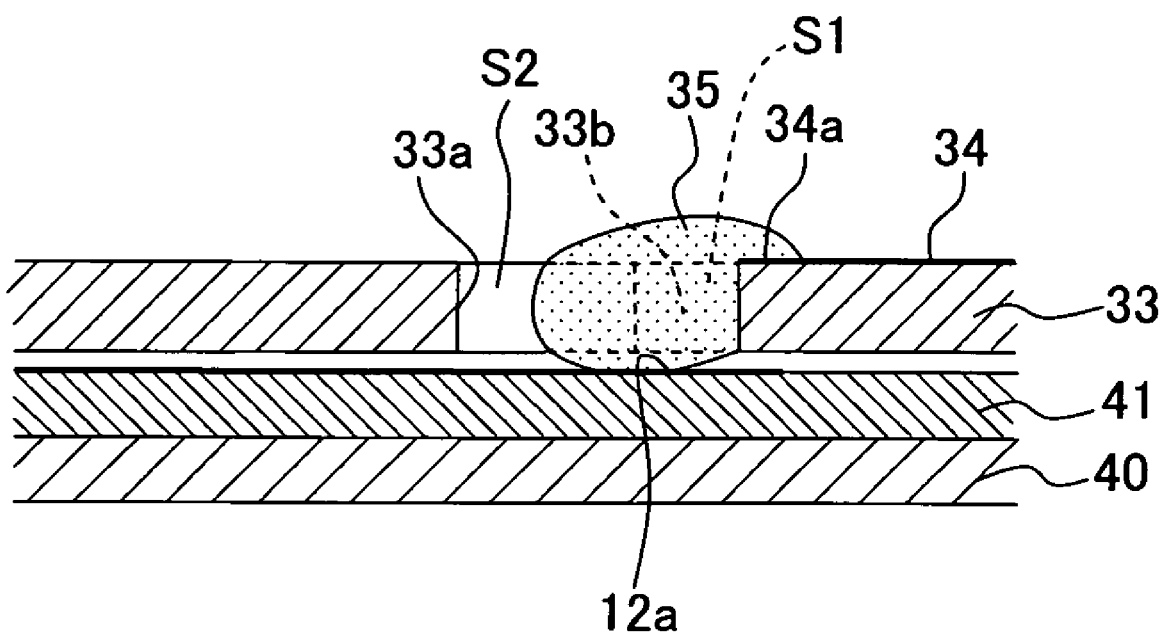
FIG. 5 is a partially enlarged view of FIG. 4.

Next, the ink-jet head 3 will be described by using FIGS. 2 to 5. FIG. 2 is a plan view of the ink-jet head 3. FIG. 3 is a partially enlarged view of FIG. 2. FIG. 4 is a cross-sectional view taken along a line IV-IV shown in FIG. 3. FIG. 5 is a partially enlarged view of FIG. 4. However, in FIG. 2, a flexible printed circuit (FPC) 33 which is arranged on an upper surface of a piezoelectric actuator 32 which will be described later is omitted.

As shown in FIGS. 2 to 5, the ink-jet head 3 includes a channel unit 31 in which an individual ink channel including a pressure chamber 10 is formed, and the piezoelectric actuator 32 which is arranged on an upper surface of the channel unit 31.

The channel unit 31, as shown in FIG. 4, includes a cavity plate 20, a base plate 21, a manifold plate 22, and a nozzle plate 23, and these four plates are joined in stacked layers. Among these four plates, the cavity plate 20, the base plate 21, and the manifold plate 22 are stainless steel plates, and an ink channel such as the pressure chamber 10 and a manifold channel (common ink chamber) 11 which will be described later, are formed in these three plates by a method such as etching. Further, the nozzle plate 23 is made of a high-molecular synthetic resin material such as polyimide, and is joined to a lower surface of the manifold plate 22. Alternatively, the nozzle plate 23 may also be made of a metallic material such as stainless steel, similar to the three plates 20 to 22.

As shown in FIGS. 2 to 4, a plurality of pressure chambers 10 (10 pressure chambers, for example) arranged along a plane is formed in the cavity plate 21, and these pressure chambers 10 are arranged in two rows in the paper feeding direction (up and down direction in FIG. 2). Each of the pressure chambers 10 is substantially elliptical and long in the scanning direction (left and right direction in FIG. 2) in a plan view.

In an area of the nozzle plate 21, overlapping with both end portions in a longitudinal direction of the pressure chambers 10, communicating holes 13 are formed at areas each of which overlaps in a plan view with an end portion on an outer side in the scanning direction of one of the pressure chambers 14, and communicating holes 14 are formed at areas each of which overlaps in a plan view with an end portion on the central side in the scanning direction of one of the pressure chambers 10. The manifold channel 11 extending in the paper feeding direction is formed in the manifold plate 22. The manifold channel 11 is arranged such that the manifold channel 11 overlaps with left halves of the pressure chambers 10 arranged on the left side in FIG. 2 and right halves of the pressure chambers 10 arranged on the right side in FIG. 2. In other words, the manifold channel 11 is arranged to overlap, in a plan view, with an area of the base plate 21 in which the communicating holes 13 are formed. Further, communicating holes 15 are formed in the manifold plate 22 at positions each of which overlaps in a plan view with one of the communicating holes 14.

The nozzles 16 are formed in the nozzle plate 23 at positions each overlapping in a plan view with one of the communicating holes 15. When the nozzle plate 23 is made of a synthetic resin material, the nozzles 16 can be formed by a process such as an excimer laser process, and when the nozzle plate 23 is made of a metallic material, the nozzles 16 can be formed by a method such as press working.

Further, the manifold channel 11 communicates with each of the pressure chambers 10 via one of the communicating holes 13, and each of the pressure chambers 10 communicates with one of the nozzles 16 via the communicating holes 14 and 15. Thus, a plurality of individual ink channels each from the manifold channel 11 up to one of the nozzles 16 via one of the pressure chambers 10 is formed in the channel unit 31.

Next, the piezoelectric actuator 32 will be described below. The piezoelectric actuator 32, as shown in FIG. 4, includes a vibration plate 40 which is formed on the upper surface of the channel unit 31; a piezoelectric layer 41 formed on the upper surface of the vibration plate 40; and a plurality of individual electrodes 12 formed on the upper surface of the piezoelectric layer 41, corresponding to the pressure chambers 10, respectively.

The vibration plate 40 is a plate having substantially rectangular shape in a plan view, and is made of a metallic material such as an iron alloy like stainless steel, a copper alloy, a nickel alloy, or a titanium alloy. The vibration plate 40 is arranged on the upper surface of the cavity plate 20 such that the vibration plate 40 covers the pressure chambers 10, and is joined to the upper surface of the cavity plate 20. The vibration plate 40 made of a metallic material is electroconductive, and also serves as a common electrode for generating an electric field in a portion of the piezoelectric layer 41 sandwiched between the individual electrode 12 and the vibration plate 40.

As shown in FIG. 4, on the upper surface of the vibration plate 40, the piezoelectric layer 41 mainly composed of lead zirconate titanate (PZT), which is a solid solution of lead titanate and lead zirconate and is a ferroelectric substance, is arranged. The piezoelectric layer 41 is formed continuously spreading across the pressure chambers 10. The piezoelectric layer 41 can be formed, for example, by an aerosol deposition method (AD method) in which very fine particles of a piezoelectric material are blown onto a substrate and collided to the substrate at high velocity, to be deposited onto the substrate. Alternatively, the piezoelectric layer 41 can also be formed, for example, by a method such as a sputtering method, a chemical vapor deposition method (CVD method), a sol-gel method, and a hydrothermal synthesis method. Still alternatively, the piezoelectric layer 41 can also be formed by cutting, to a predetermined size, a piezoelectric sheet which is prepared by baking a green sheet of PZT, and sticking the cut piezoelectric sheet or sheets to the vibration plate 40.

The individual electrodes 12 are formed in the upper surface of the piezoelectric layer 41. Each of the individual electrodes 12 has an elliptic shape in a plan view and is smaller in size to some extent than one of the pressure chambers 14. The individual electrodes 18 are formed at positions each of which overlaps in a plan view with one of the pressure chambers 14. Further, the individual electrodes 12 are made of an electroconductive material such as gold, copper, silver, palladium, platinum, or titanium. Further, contact points 12a are formed in the individual electrodes 12, respectively. Each of the contact points 12a extends outwardly from an end portion in the longitudinal direction of one of the individual electrodes 12, the end portion being on a side of the manifold channel 11. The contact points 12a of the individual electrode 12 will be described later in detail. The individual electrodes 12 can be formed by a method such as a screen printing, the sputtering method, and a vapor deposition method.

As shown in FIGS. 3 to 5, a flexible printed circuit (FPC) 33 is arranged on the upper surface of the piezoelectric actuator (connection-objective member) 32. Wirings 34 each having a contact point 34a for making a connection with one of the contact points 12a is formed on an upper surface (first surface) of the FPC 33, and the FPC 33 is arranged such that the contact point 34a overlaps with one of the contact points 12a in a plan view. Further, a through hole (second space) 33a substantially circular in shape and having openings in the upper surface and the lower surface, respectively, of the FPC 33 is formed in the FPC 33 at a position in which the contact point 34a and the contact point 12a overlap in a plan view. Furthermore, a notch 33b having openings in the upper surface and the lower surface, respectively, of the FPC 33 is formed in an inner surface (surface) of the FPC 33 defining the through hole 33a, and a first space S1 is defined by the notch 33b. A width of the notch 33b (length in the up and down direction in FIG. 3) is narrower than a diameter of the through hole 33a. An electroconductive member 35 is filled in the notch 33b and a portion of the through hole 33a, the portion being adjacent to the notch 33b; and the contact point 12a of the individual electrode 12 and the contact point 34a of the wiring 34 are electrically connected via the electroconductive member 35. The wirings 34 are connected to a driver IC which is not shown in the diagram, and an electric potential of the individual electrodes 12 is selectively controlled by the driver IC 12 via the wirings 34 and the electroconductive material 35.

Here, a method of forming the electroconductive member 35 which electrically connects the contact point 34a of the wiring 34 formed on the upper surface of the FPC 33 and the contact point 12a of the individual electrode 12 will be described with reference to FIG. 6 (FIGS. 6A to 6E). FIGS. 6A to 6E are cross-sectional views showing in steps a method of electrically connecting the contact point 12a and the contact point 34a.

Figure 6A:
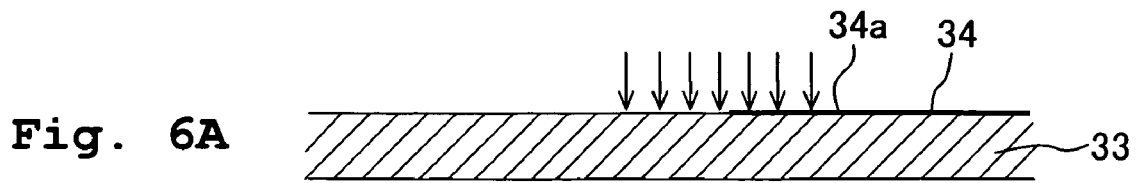
FIG. 6A to FIG. 6E are cross-sectional views showing, in steps, a method of forming an electroconductive member in FIG. 5.
Figure 6B:
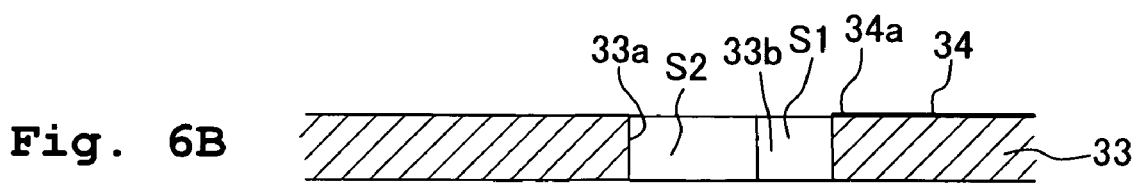
Figure 6C:
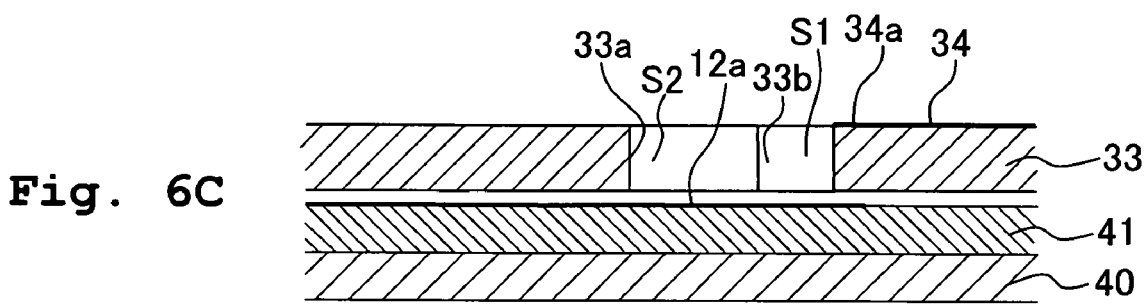
Figure 6D:
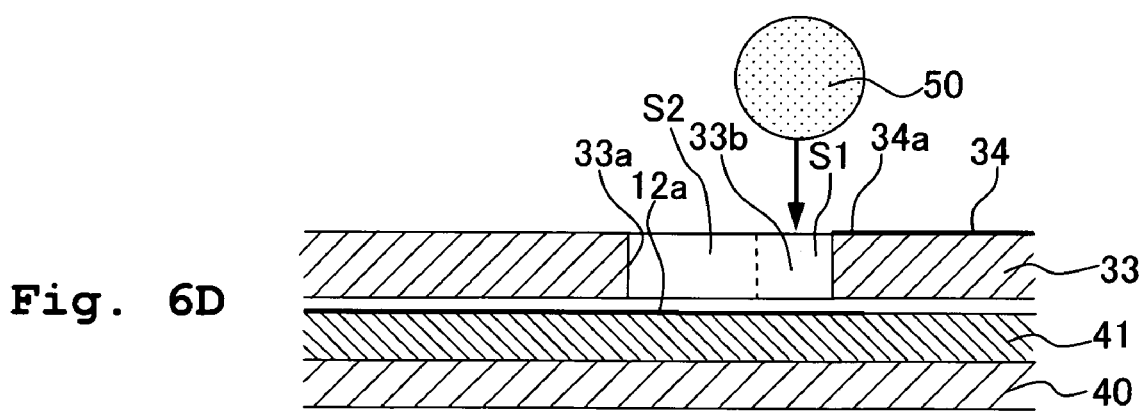
Figure 6E:
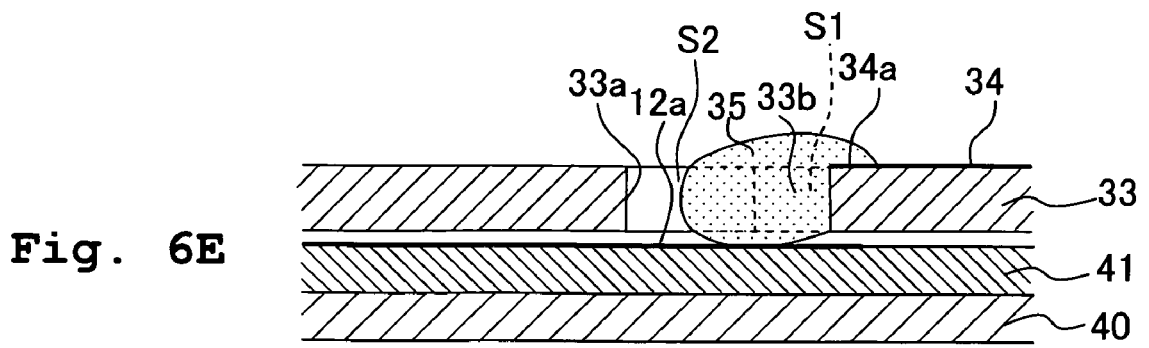

For electrically connecting the contact point 12a and the contact point 34a, firstly, as shown in FIG. 6A, a laser beam is irradiated vertically (perpendicularly) from an upper side (or from a position above?) onto the upper surface of the FPC 33 on which the wirings 34 each having the contact point 34a on an upper surface thereof are formed, thereby forming, as shown in FIG. 6B, a through hole (second space) 33a and a notch (single notch) 33b in the FPC 33 (substrate producing step). Next, as shown in FIG. 6C, the FPC 33 is arranged while positioning the FPC 33 such that the contact point 12a and the contact point 34a are overlapped in a plan view, in other words, the contact point 12a, the through hole 33a, and the notch 33b are overlapped (arranging step, substrate arranging step). Next, as shown in FIG. 6D, by using an ink-jet head or a micro dispenser, an electroconductive liquid droplet 50 having a diameter greater than the width of the notch 33b is jetted from a position above the FPC 33 so that the electroconductive liquid droplet 50 lands on a part of the notch 33b and does not land on a part of the through hole 33a (landing step, electroconductive liquid droplet jetting step). When the electroconductive liquid droplet 50 is jetted, an amount of the electroconductive liquid droplet 50 is adjusted such that the electroconductive liquid droplet 50 is arisen above the upper surface of the FPC 33.

The width of the notch 33b is smaller than a diameter of the electroconductive liquid droplet 50, and the electroconductive liquid droplet 50 jetted on the upper surface of the FPC 33 is flowed up to a lower surface of the FPC 33 along the notch 33b due to the capillary force which will be described later. Further, the electroconductive liquid droplet 50 which has reached up to the lower surface of the FPC 33 is electrically connected to the contact point 12a of the individual electrode 12. Furthermore, the electroconductive liquid droplet 50 is flowed from the notch 33b to the through hole 33a, and the electroconductive liquid droplet 50 is also filled in a portion of the through hole 33a, the portion being adjacent to the notch 33b. Accordingly, the electroconductive liquid droplet 50 is connected to the contact point 12a of the individual electrode 12 even in an area of the individual electrode 12, the area overlapping with the through hole 33a in a plan view. At this time, air which was present in the through hole 33a and the notch 33b before jetting the electroconductive liquid droplet 50 does not remain between the electroconductive liquid droplet 50 and the individual electrode 12, and goes out from an area of the through hole 33a on which the electroconductive liquid droplet 50 has not landed. Further, the electroconductive liquid droplet 50 which is filled is solidified, and the electroconductive member 35 is formed in the notch 33b and a portion, of the through hole 33a, adjacent to the notch 33b, as shown in FIG. 6D. Thus, the contact point 34a of the wiring 34 and the contact point 12a of the individual electrode 12 are electrically connected via the electroconductive member 35.

Here, the above-mentioned capillary force will be briefly explained. The capillary force means a force acting on a liquid which is contained inside a solid body in the form of a tube in particular, from among forces acting on a liquid level of the liquid by an interaction between the liquid and the solid body. For example, in a tube member such as a straw in which a through hole is formed, it has been known that in general when a diameter of the hole is not more than about 2 mm to 3 mm, the capillary force acting on a liquid filled inside the hole is of a magnitude which is not negligible as compared to a gravitational force acting on the per unit length of the liquid. Here, as the diameter of the hole becomes smaller, the magnitude of the capillary force acting on the liquid increases further as compared to the magnitude of the gravitational force acting on per unit length of the liquid. In other words, as a ratio of a length of a line of intersection between the liquid surface and the inner surface of the tube, to a cross-sectional area of the tube in which the liquid is filled is increased, the magnitude of the capillary force with respect to the gravitational force acting per unit length of the liquid is increased.

Next, an action of the piezoelectric actuator 32 will be described below. When an electric potential of the individual electrodes 12 is selectively controlled by the driver IC, an electric potential difference is developed between the individual electrode 12 and the vibration plate 40 as the common electrode, and an electric field in a direction of a thickness of the piezoelectric layer 41 is generated in a portion of the piezoelectric layer 41 sandwiched between the individual electrode 12 and the vibration plate 40. At this time, when a direction in which the piezoelectric layer 41 is polarized is same as a direction of the electric field, the piezoelectric layer 41 is contracted in a horizontal direction which is orthogonal to the thickness direction. With the contraction of the piezoelectric layer 41, the vibration plate 40 is deformed to project toward the pressure chamber 10. With the deformation of the vibration plate 40, the volume of the pressure chamber 10 is decreased and a pressure in the pressure chamber 10 is increased, thereby discharging the ink from a nozzle 17 communicating with the pressure chamber 10.

According to the first embodiment described above, at a time of forming the electroconductive member 35 for electrically connecting the contact point 12a of the individual electrode 12 and the contact point 34a of the wiring 34, firstly, the through hole 33a and the notch 33b are formed in the FPC 33, and next the electroconductive liquid droplet 50 having the diameter greater than the width of the notch 33b is jetted from a position above the FPC 33 such that the electroconductive liquid droplet 50 lands on the opening of the notch 33b. At this time, since the width of the notch 33b is sufficiently small, the capillary force of sufficient strength acts on the electroconductive liquid droplet 50. Therefore, the electroconductive liquid droplet 50 flows in a direction of thickness of the FPC 33 along the notch 33b, and is reached assuredly up to the lower surface of the FPC 33. Accordingly, even when a condition of the surface defining the through hole 33a is not satisfactory, for example, even when the surface defining the through hole 33a is rough, it is possible to prevent the occurrence of poor connection which would be otherwise caused due to the electroconductive liquid droplet 50 solidified before reaching up to the lower surface of the FPC 33. Therefore, the contact point 12a and the contact point 34a can be electrically connected assuredly.

Further, since the electroconductive liquid droplet 50 is jetted such that the electroconductive liquid droplet 50 is not landed at least on a portion or part of the opening of the through hole 33a, the air which was present in the through hole 33a and the notch 33b is escaped to the outside from the portion of the opening of the through hole 33a on which the electroconductive liquid droplet 50 is not landed. Therefore, it is possible to prevent a poor connection which would be otherwise caused due to the solidification of the electroconductive liquid droplet 50 in the present of the air remained between the contact point 12a and the electroconductive liquid droplet 50, thereby electrically connecting the contact point 12a and the contact point 34a assuredly.

Further, since the notch 33b is formed, as compared to a case in which the notch 33b is not formed, the joining area of the contact point 12a and the electroconductive member 35 is increased by an area of the space occupied by the opening of the notch 33b in the lower surface of the FPC 33. Therefore, the joining strength is increased.

Furthermore, since it is possible to form the electroconductive member 35 for electrically connecting the contact point 12a and the contact point 34a by a simple method of jetting the electroconductive liquid droplet 50 on the notch 33b, the producing process is simplified.

Further, since one notch 33b is formed corresponding to a through hole 33a, the electroconductive liquid droplet 50 is to be jetted only from one location for forming one electroconductive member 35, and the producing process is simplified.

Next, modified embodiments in which various changes are made to the first embodiment will be explained. Same reference numerals will be given to parts or components having similar construction as those in the first embodiment, and explanation therefor will be omitted as appropriate.

First Modified Embodiment

Figure 7:
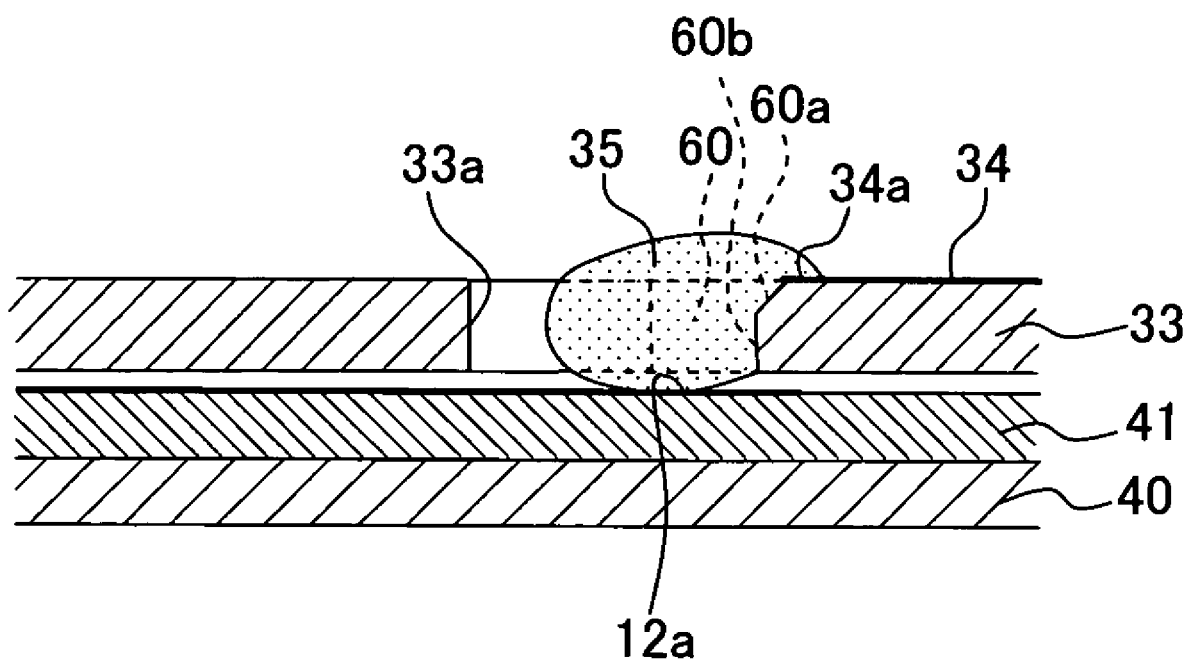
FIG. 7 is a cross-sectional view of a first modified embodiment, corresponding to FIG. 5.

As shown in FIG. 7, a notch 60 of the FPC 33 may be defined by an inclined surface 60a and a vertical surface 60b. The inclined surface 60a is communicated with the upper surface of the FPC 33, and a side of the inclined surface 60a on a side of the lower surface of the FPC 33 is inclined toward the inner side of the through hole 33a. The vertical surface 60b is communicated with the inclined surface 60a and the lower surface of the FPC 33. In the electroconductive liquid droplet jetting step, the electroconductive member 35 may be formed by jetting the electroconductive liquid droplet 50 such that the electroconductive liquid droplet 50 is landed at least on the inclined surface 60a. In this case, since the landed electroconductive liquid droplet 50 flows along the inclined surface 60a, the electroconductive liquid droplet 50 can be made to flow assuredly along the notch 60. Further, such an inclined surface 60a can be formed in the substrate producing step, after forming the through hole 33a and the notch 60, by further irradiating the laser beam, on the upper surface of the FPC 33, from a direction inclined toward an outer side of the through hole 33a (right side in FIG. 7) with respect to a direction perpendicular to the upper surface of the FPC 33.

Second Modified Embodiment

Figure 8:
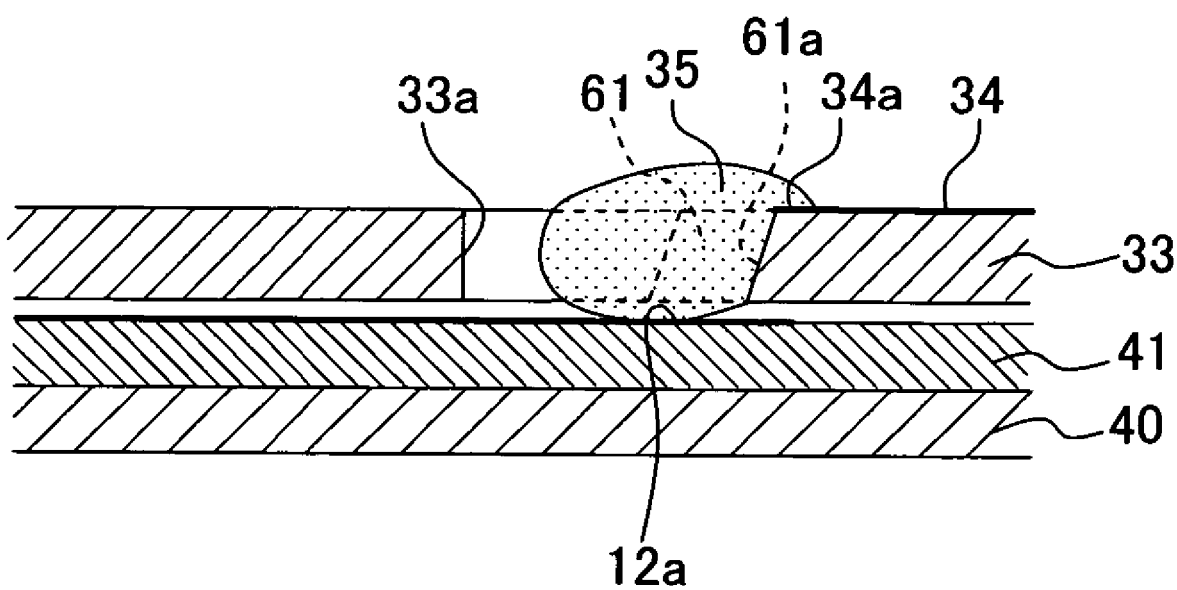
FIG. 8 is a cross-sectional view of a second modified embodiment, corresponding to FIG. 5.

An inclined surface 61a of a notch 61 may be extended up to the lower surface of the FPC 33, and communicated with the lower surface of the FPC 33 as shown in FIG. 8. In this case, the electroconductive liquid droplet 50 can be made to flow assuredly along the inclined surface 61a, up to the lower surface of the FPC 33.

Third Modified Embodiment

Figure 9:
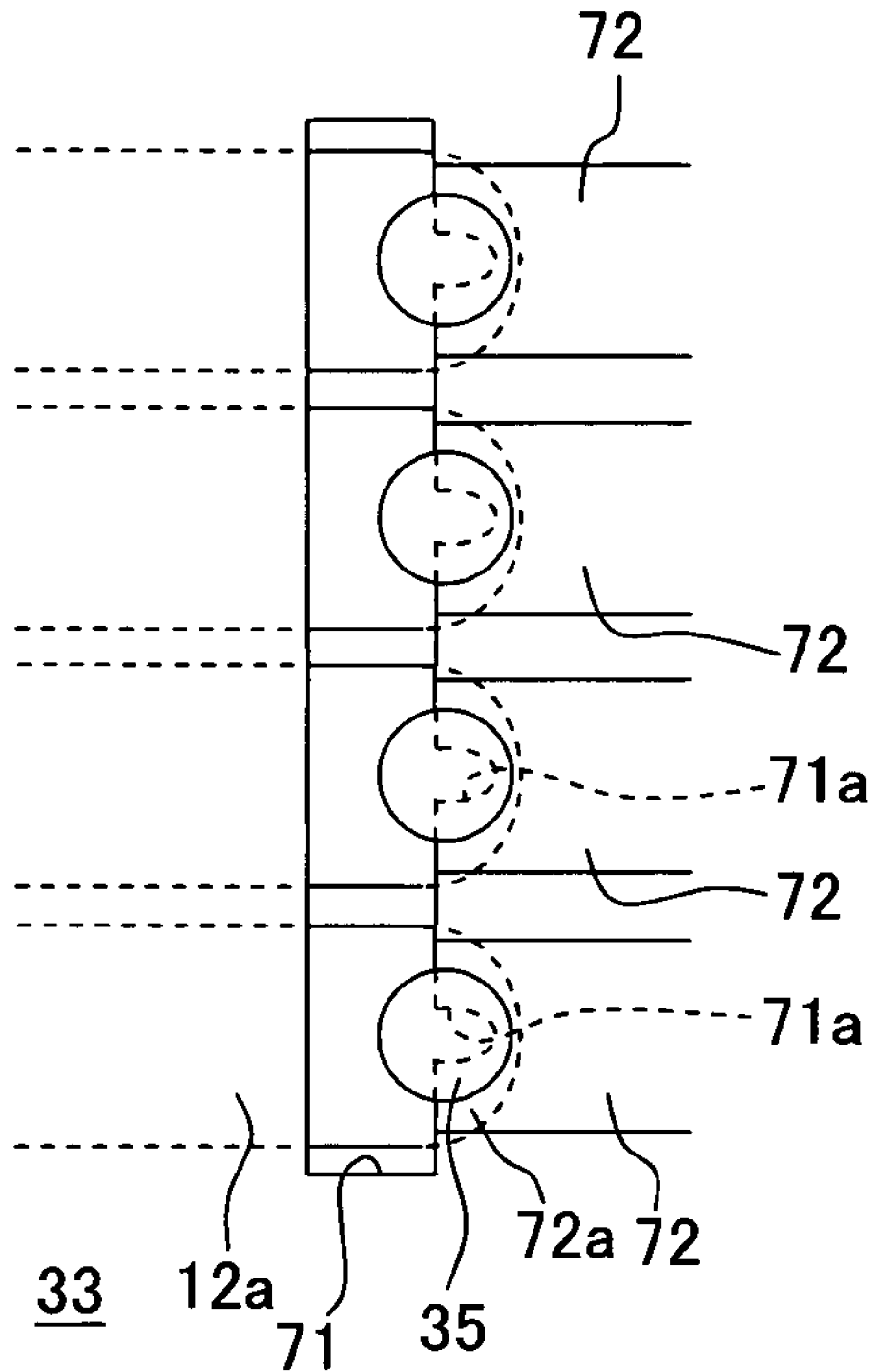
FIG. 9 is a plan view showing a connecting portion of individual electrodes and wirings of a third modified embodiment.

Further, a through hole to be formed in the FPC 33 may be formed commonly for a plurality of individual electrodes. For example, in FIG. 9, a through hole 71 formed as a slit extending in a up and down direction spreading over a plurality of contact points 12a of the individual electrodes 12 (four individual electrodes, for example) and a plurality of contact points 72a of wirings 72. Furthermore, notches (individual notches) 71a are formed in a portion of the FPC 33 overlapping with the contact points 12a and the contact points 72a. In the electroconductive liquid droplet jetting step, the electroconductive member 35 may be formed by jetting the electroconductive liquid droplet 50 separately on each of the notches 71a. In this case, although the plurality of notches 71a is formed corresponding to (for) one through hole 71, the electroconductive liquid droplet 50 easily flows in each of the notches 71a along a direction of thickness of the FPC 33, and the electroconductive liquid droplet 50 hardly flows, in each of the notches 71a, in a direction other than the direction of thickness of the FPC 33. Therefore, since the electroconductive liquid droplets 50 jetted on adjacent notches 71a do not come in mutual contact, the mutually independent contact points 12a and the mutually independent contact points 72a can be connected in one through hole 71.

Fourth Modified Embodiment

Figure 10:
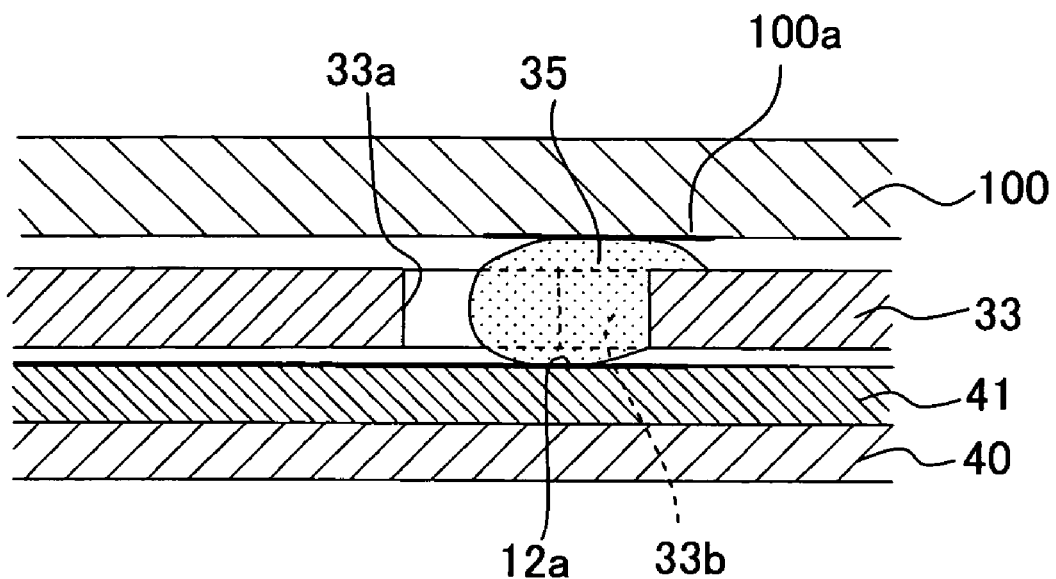
FIG. 10 is a cross-sectional view of a fourth modified embodiment, corresponding to FIG. 5.

In the first embodiment, the individual electrodes 12 and the driver IC were connected via the wirings 34 formed on the upper surface of the FPC 33. However, as shown in FIG. 10, a driver IC 100 may be arranged at a position above the FPC 33 such that a contact point 100a of the driver IC 100 overlaps with each of the through holes 33a and each of the notches 33b in a plan view, and the contact point 12a of each of the individual electrodes 12 and the contact point 100a of the driver IC 100 may be connected via the electroconductive member 35 filled in the notch 33b and the through hole 33a. In this case, the portion of the electroconductive member 35 which has arisen above the upper surface of the FPC 33 becomes a bump for connecting the individual electrodes 12 with the driver IC 100.

Figure 11A:
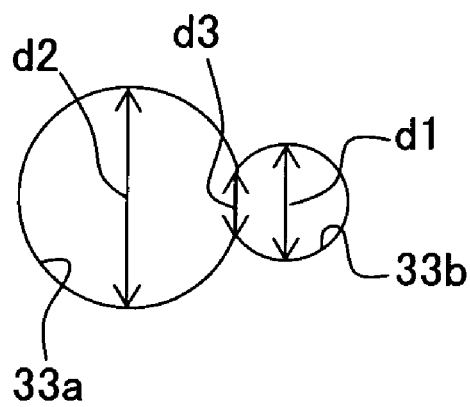
FIG. 11A is schematic view showing a case in which a width of a boundary portion between a through hole and a notch is narrower than a width of the notch.
Figure 11B:
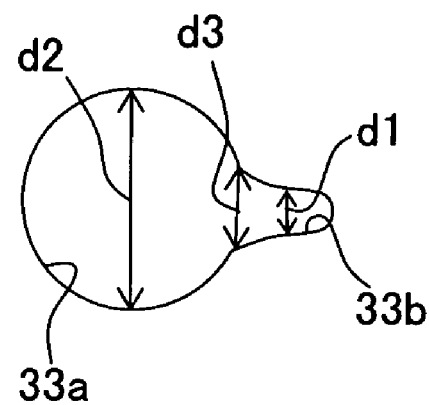
FIG. 11B is a schematic view showing a case in which the width of the boundary portion between the through hole and the notch is wider than width of the notch.

In the first embodiment and the modified embodiments as mentioned above, the width of the notch 33b is the same as a width of a communicating portion which is a boundary between the notch 33b and the through hole 33a, and the diameter of the through hole 33a is formed to be greater than the width of the communicating portion. However, a width d1 of the notch 33b, a diameter d2 of the through hole 33a, and a width d3 of the communicating portion may be arbitrary, provided that the dimensions of d1, d2 and d3 are sufficient to make the capillary force acting on the electroconductive liquid droplet 50 in the notch 33b to be sufficiently substantial, and that the dimensions of d1, d2 and d3 allow the electroconductive liquid droplet 50 to flow along the notch 33b due to the capillary force. For example, as shown in FIG. 11A, the width d1 of the notch 33b may be smaller than the diameter d2 of the through hole 33a, and further the width d3 of the communicating portion may be smaller than the width d1 of the notch 33b. Alternatively, as shown in FIG. 11B, the width d3 of the communicating portion may be greater than the width d1 of the notch 33b. The diagrammatic representation in FIGS. 11A and 11B is only exemplification, and the through hole, the notch, and the communicating portion may have any other shape and/or dimensions. For example, the width of the through hole may be smaller than the width of the notch.

Second Embodiment

Next, a second embodiment of the present invention will be described below. Since the second embodiment differs from the first embodiment in terms of a connection of the contact point of individual electrode and the contact point of FPC, this difference will be particularly described in detail.

Figure 12:
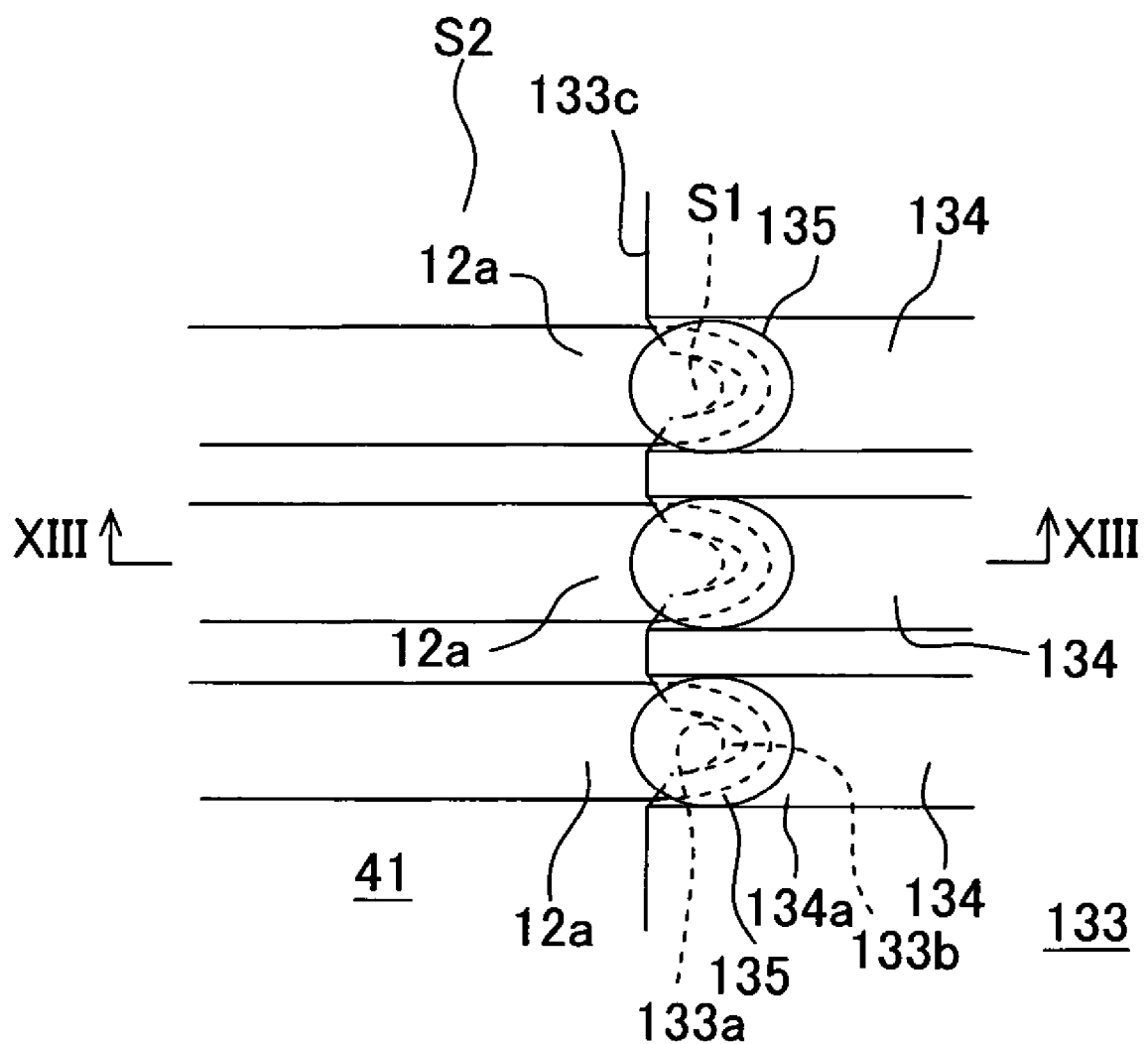
FIG. 12 is a plan view showing a connecting portion of individual electrodes and wirings according to a second embodiment of the present invention.
Figure 13:
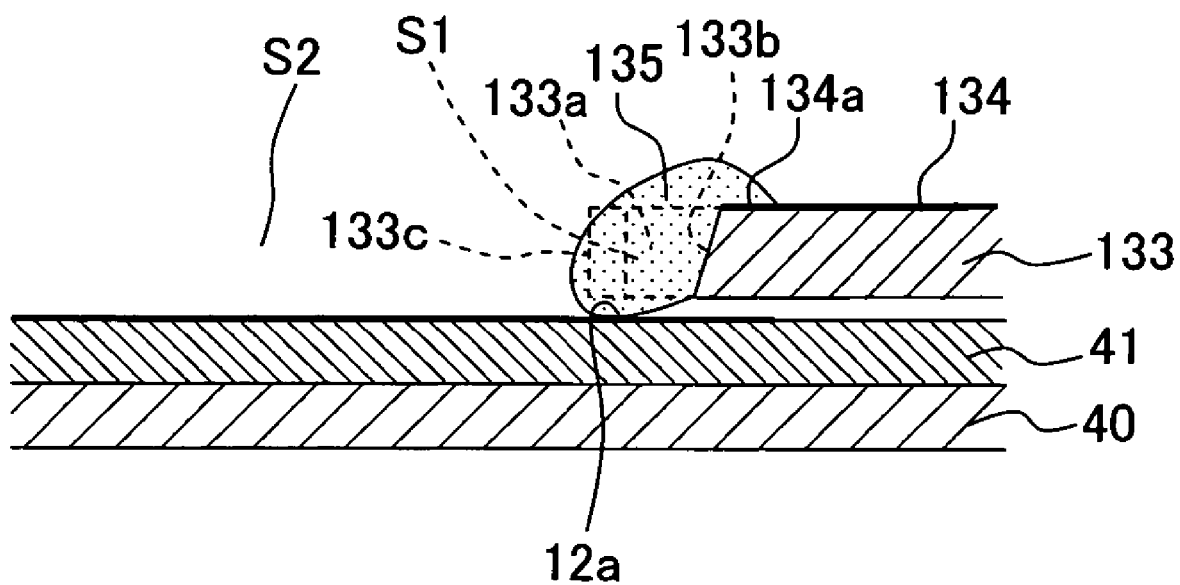
FIG. 13 is a cross-sectional view taken along a line XIII-XIII shown in FIG. 12.

FIG. 12 is a plan view showing an area surrounding a portion in which the contact points 12a of the individual electrodes 12 and contact points 134a of a plurality of wirings 134 formed on an upper surface of an FPC 133 are connected. FIG. 13 is a cross-sectional view taken along a line XIII-XIII shown in FIG. 12. As shown in FIGS. 12 and 13, in the second embodiment, the contact points 134a of the wirings 134 are arranged along a side wall (side-wall surface) 133c of the FPC 133, and notches 133a are formed for the contact points 134a respectively, the notches 133a being formed on the side wall 133c of the FPC 133 at positions each of which overlaps with one of the contact points 134a. Each of the notches 133a is formed by a tapered surface 133a which is tapered toward the lower surface of the FPC and which is communicated with the upper and lower surfaces of the FPC 133. In other words, a first space S1 is formed by one of the notches 133a and a second space S2 is formed by the side wall 133c of the FPC 133. Further, the contact point 12a and the contact point 134a are electrically connected via an electroconductive member 135 formed on an inner side of each of the notches 133a, and via an electroconductive member 135 formed in a portion of the side wall 133c of the FPC 133, the portion being adjacent to each of the notches 133a. Here, each of the notches 133a is formed such that a width of the notch 133a is smaller than a diameter of an electroconductive liquid droplet 150 which will be described later.

Next, a method of forming the electroconductive member 135 and electrically connecting the contact points 12a and the contact points 134a will be described with reference to FIGS. 14A to 14F. FIGS. 14A to 14F are cross-sectional views showing, in steps, a method of electrically connecting the contact point 12a and the contact point 134a.

Figure 14A:
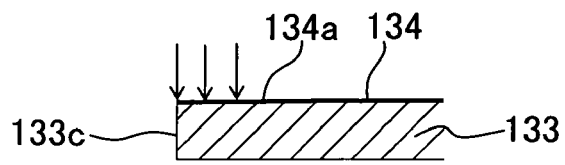
FIG. 14A to FIG. 14F are cross sectional views showing, in steps, a method of forming an electroconductive member in FIG. 13.
Figure 14B:
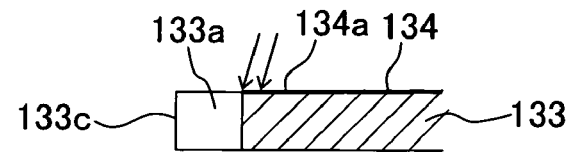
Figure 14C:
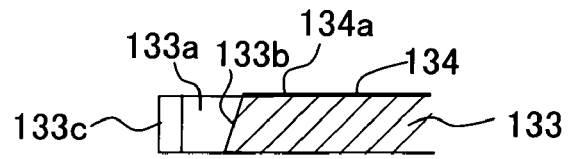
Figure 14D:
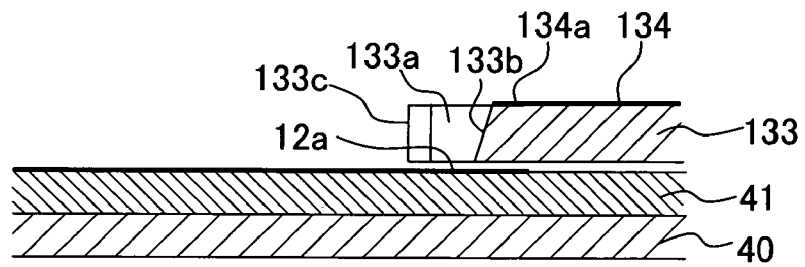
Figure 14E:
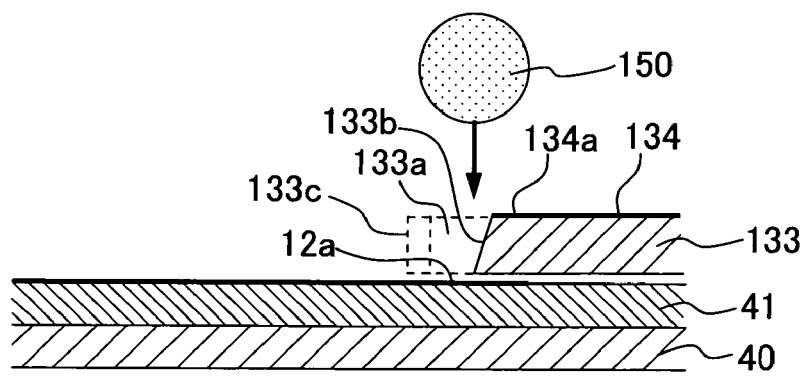

At the time of electrically connecting the contact point 12a and the contact point 134a, firstly, the laser beam is irradiated vertically from a position above on the upper surface of the FPC 133 on which a wiring 134 and a contact point 134a are formed as shown in FIG. 14A, thereby forming a notch 133a as shown in FIG. 14B. Further, the laser beam is irradiated from a direction inclined, toward a side opposite to the side wall 133c of the FPC 133 (right side in FIG. 14A), from the vertical (perpendicular) direction with respect to the upper surface of the FPC 133. By irradiating the laser beam from the inclined direction, a side surface defining the notch 133a is formed as a tapered surface 133b which has a tapered shape toward the lower surface side of the FPC 133 and which is communicated with the upper and lower surfaces of the FPC 133 as shown in FIG. 14C (substrate producing step). Next, as shown in FIG. 14D, the FPC 133 is arranged to be positioned such that the contact point 12a and the notch 133a are overlapped in a plan view (substrate arranging step). Next, as shown in FIG. 14E, by the an ink-jet head or by a micro dispenser, an electroconductive liquid droplet 150 having a diameter greater than the width of the notch 133a is jetted from a position above the FPC 133, and the electroconductive liquid droplet 150 is landed at least on the tapered surface 133b of the notch 133a (landing step, electroconductive liquid droplet jetting step). When the electroconductive liquid droplet 150 is jetted, an amount of the electroconductive liquid droplet 150 is adjusted such that the jetted electroconductive liquid droplet 150 is arisen above the upper surface of the FPC 133.

Figure 14F:
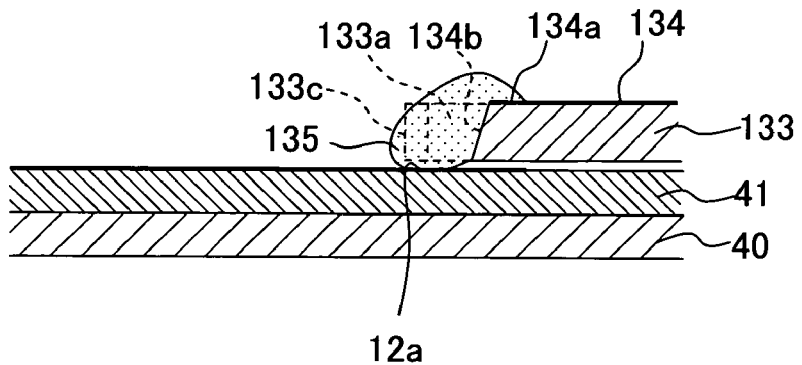

The width of the notch 133b is smaller than the diameter of the electroconductive liquid droplet 150, and a part the electroconductive liquid droplet 150, jetted on the surface of the FPC 133, flows along the notch 133a due to the capillary force and reaches up to the lower surface of the FPC 133. At this time, since the tapered surface 133c is tapered toward the lower surface side of the FPC 133, the electroconductive liquid droplet 150 flows along the tapered surface 133b up to the lower surface of the FPC 133 assuredly. Further, the electroconductive liquid droplet 150 which has reached the lower surface of the FPC 133 is connected to the contact point 12a of the individual electrode 12. Furthermore, since the electroconductive liquid droplet 150 starts to flow toward the second space which is outside of the notch 133a, in other words, toward the side wall 133c of the FPC 133, and the electroconductive liquid droplet 150 is also adhered to a portion of the side wall of the FPC 133, the portion being adjacent to the notch 133a. Therefore, even in an area overlapping with the portion in a plan view, the electroconductive liquid droplet 150 is also connected to the contact point 12a of the individual electrode 12. Further, the electroconductive liquid droplet 150 is solidified, and as shown in FIG. 14F, the electroconductive member 135 is formed on the inner side of the notch 133a, and on the portion of the side wall of the FPC 133, the portion being adjacent to the notch 133a. Thus, the contact point 134a of the wiring 134 and the contact point 12a of the individual electrode 12 are electrically connected via the electroconductive member 135.

According to the second embodiment described above, for forming the electroconductive member 135 along the side wall 133c of the FPC 133 for connecting the contact point 12a of the individual electrode 12 and the contact point 134a of the wiring 134, firstly, the notch 133a is formed along the side wall 133c of the FPC 133, and the electroconductive liquid droplet 150 having a diameter greater than the width of the notch 133a is jetted from a position above the FPC 133 such that the electroconductive liquid droplet 150 is landed at least on the tapered surface 133b of the notch 133a in a plan view. Since the width of the notch 133a is sufficiently narrow to the extent that the capillary force acts effectively, the part of the electroconductive liquid droplet 150 flows assuredly in a direction of thickness of the FPC 133 along the notch 133a due to the capillary force, and then reaches up to the lower surface of the FPC 133. Consequently, it is possible to prevent occurrence of poor connection which would be otherwise caused by the solidification of the electroconductive liquid droplet 150 without reaching up to the lower surface of the FPC 133 due to the condition of the side wall 133c of the FPC 133 such as a roughness of a surface of the side wall, and/or due to a mutual contact between adjacent electroconductive liquid droplets 150, and it is possible to electrically connect the contact points 12a and the contact points 134a respectively in an assured manner.

Further, since the notch 133a is formed, as compared to a case in which the notch 133a is not formed, a joining area of the contact point 12a and the electroconductive member 135 is increased by an area of the space occupied by an opening of the notch 133a in the lower surface of the FPC 133. Therefore, the joining strength is increased.

Furthermore, since the surface of the FPC 133 which defines the notch 133a is communicated with the upper and lower surfaces of the FPC 133, and has the tapered surface 133b tapered toward the lower surface of the FPC 133, the electroconductive liquid droplet 150 flows along the tapered surface 133b up to the lower surface of the FPC 133 assuredly.

Further, since it is possible to form the electroconductive member 135 for electrically connecting the contact point 12a and the contact point 134a by a simple method of jetting the electroconductive liquid droplet 150 on the notch 133a, the producing process is simplified.

Next, modified embodiments in which various modifications are made in the second embodiment, will be described below.

In the second embodiment, the surface defining the notch 133a is communicated with the upper and lower surfaces of the FPC 133, and is formed as the tapered surface tapered toward the lower surface of the FPC 133. However, as in the first modified embodiment of the first embodiment, the tapered surface may be formed to be communicated only with the upper surface of the FPC 133. Further, the tapered surface 133*b* may not be formed as in the case of the first embodiment, and the surface defining the notch 133*a* may be extended in the thickness direction of the FPC 133.

Furthermore, similarly as in the fourth modified embodiment of the first embodiment, the contact point 12*a* of the individual electrode 12 and the contact point of the driver IC may be connected, not via the wiring 134, but connected with the portion of the electroconductive member 135 which has arisen as a bump above the upper surface of the FPC 133. Further, dimensions and/or shape of the notch 133*a* may be arbitrary, provided that the capillary force acting on the electroconductive liquid droplet 150 flowing through the notch 133*a* is sufficiently substantial.

What is claimed is:

1. A method of producing a wire-connection structure comprising:
    an insulating substrate providing step of providing an insulating substrate comprising a first surface and a second surface facing mutually, and in which a first space is formed to communicate the first surface with the second surface, and a second space is formed to communicate with the first space;
    a connection-objective member providing step of providing a connection-objective member comprising a contact point to be electrically connected to the insulating substrate;
    an arranging step of arranging the insulating substrate and the connection-objective member, such that an area of the insulating substrate, in which the first space is formed, faces the contact point of the connection-objective member; and
    a landing step of landing an electroconductive liquid droplet with a diameter greater than a width of the first space on the area of the insulating substrate in which the first space is formed, such that the electroconductive liquid droplet overlaps with the second space,
    wherein the first space forms a tube or a U-shaped notch in the insulating substrate and dimensions of the first space are the dimensions which allow the electroconductive liquid droplet to flow toward the second surface by an action of the capillary force acting on the electroconductive liquid droplet, the capillary force being a force acting on a liquid inside the tube or the U-shaped notch within the insulating substrate, and a width of the first space is smaller than a width of the second space.

2. The method of producing the wire-connection structure according to claim 1, wherein:
    the second space is a through hole which is formed in the insulating substrate and is formed to communicate the first surface with the second surface;
    the first space is defined by a notch which is formed in an inner surface of the insulating substrate in which the through hole is defined; and
    the electroconductive liquid droplet is landed, in the landing step, on an area including an area of the insulating substrate in which the notch has been formed and excluding a part of an area in which the through hole of the insulating substrate has been formed.

3. The method of producing the wire-connection structure according to claim 2, wherein the notch is formed as one single notch corresponding to the through hole.

4. The method of producing the wire-connection structure according to claim 2, wherein:
    the notch is formed as a plurality of individual notches which are mutually separated and which correspond to the through hole; and
    the electroconductive liquid droplet is landed separately for each of the individual notches in the landing step.

5. The method of producing the wire-connection structure according to claim 2, wherein:
    an inner surface, of the insulating substrate, defining the notch is communicated with the first surface and is formed as a tapered surface which is tapered toward the second surface; and
    the electroconductive liquid droplet is landed on the tapered surface in the landing step.

6. The method of producing the wire-connection structure according to claim 5, wherein the tapered surface communicates with the first surface and the second surface.

7. The method of producing the wire-connection structure according to claim 1, wherein:
    the second space is defined by a side-wall surface, of the insulating substrate, which is formed to communicate the first surface with the second surface, and the first space is defined by a notch which is formed in the side-wall surface and which has an opening in the first surface and an opening in the second surface of the insulating substrate;
    the opening of the notch formed in the second surface is arranged to face the contact point of the connection-objective member in the substrate arranging step; and
    the electroconductive liquid droplet with the diameter greater than the width of the notch is landed, in the landing step, on an area including the opening of the notch formed in the first surface of the insulating substrate.

8. The method of producing the wire-connection structure according to claim 7, wherein:
    the notch is formed as a plurality of individual notches which are mutually separated and arranged along the side-wall surface; and
    the electroconductive liquid droplet is landed separately for each of the individual notches in the landing step.

9. The method of producing the wire-connection structure according to claim 7, wherein:
    an inner surface of the insulating substrate defining the notch is communicated with the first surface, and is formed as a tapered surface which is tapered toward the second surface; and
    the electroconductive liquid droplet is landed on the tapered surface in the landing step.

10. The method of producing the wire-connection structure according to claim 9, wherein the tapered surface communicates with the first surface and the second surface.

11. The method of producing the wire-connection structure according to claim 1, wherein the electroconductive liquid droplet is landed in the landing step such that the electroconductive liquid droplet rises above the first surface.

12. The method of producing the wire-connection structure according to claim 1, wherein a width of a communicating portion which is a boundary between the first space and the second space is smaller than the width of the first space.

* * * * *